(12) United States Patent
Wang et al.

(10) Patent No.: US 12,057,361 B2
(45) Date of Patent: Aug. 6, 2024

(54) CHIP ENCAPSULATION STRUCTURE AND ENCAPSULATION METHOD

(71) Applicant: Epicmems (Xiamen) Co., Ltd., Fujian (CN)

(72) Inventors: Wei Wang, Fujian (CN); Ping Li, Fujian (CN); Yanhao Peng, Fujian (CN); Nianchu Hu, Fujian (CN); Bin Jia, Fujian (CN)

(73) Assignee: Epicmems (Xiamen) Co., Ltd., Fujian (CN)

( * ) Notice: Subject to any disclaimer, the term of this patent is extended or adjusted under 35 U.S.C. 154(b) by 341 days.

(21) Appl. No.: 17/614,434

(22) PCT Filed: May 28, 2019

(86) PCT No.: PCT/CN2019/088777
§ 371 (c)(1),
(2) Date: Nov. 26, 2021

(87) PCT Pub. No.: WO2020/237499
PCT Pub. Date: Dec. 3, 2020

(65) Prior Publication Data
US 2022/0230931 A1 Jul. 21, 2022

(51) Int. Cl.
*H01L 23/28* (2006.01)
*H01L 21/48* (2006.01)
(Continued)

(52) U.S. Cl.
CPC ...... *H01L 23/3135* (2013.01); *H01L 21/4814* (2013.01); *H01L 21/56* (2013.01);
(Continued)

(58) Field of Classification Search
CPC ............. H01L 23/3178; H01L 23/3135; H01L 23/49833; H01L 23/495; H01L 21/56
(Continued)

(56) References Cited

U.S. PATENT DOCUMENTS 4,729,061 A * 3/1988 Brown ................. H05K 1/0206
257/E23.101
6,952,049 B1 * 10/2005 Ogawa .................. H01L 23/642
257/700
(Continued)

FOREIGN PATENT DOCUMENTS

CN 205264695 U 5/2016
CN 106301283 A 1/2017
(Continued)

OTHER PUBLICATIONS

International Search Report for International Patent Application No. PCT/CN2019/088777 (Feb. 5, 2020).

*Primary Examiner* — Nitin Parekh
(74) *Attorney, Agent, or Firm* — Merchant & Gould P.C.

(57) ABSTRACT

A chip encapsulation structure, including: a wafer provided with a groove; a first metal wire arranged on surfaces of the groove and the wafer; a metal solder ball arranged on the first metal wire or on a metal pad of the chip, and is configured to solder the metal pad of the chip to the first metal wire; a first plastic encapsulation film covering upper surfaces of the wafer, the chip and the first metal wire, and entering a gap between a periphery of a functional area of the chip and the first metal wire, so as to form a closed cavity among the wafer, the groove and the chip; an inductive structure arranged on an upper surface of the first plastic encapsulation film and/or a lower surface of the wafer, and connected to the chip through the first metal wire; and a pad arranged on the inductive structure.

10 Claims, 10 Drawing Sheets

(51) Int. Cl.
  *H01L 21/56* (2006.01)
  *H01L 23/00* (2006.01)
  *H01L 23/31* (2006.01)
  *H01L 23/498* (2006.01)
  *H01L 23/64* (2006.01)
  *H01L 25/065* (2023.01)

(52) U.S. Cl.
  CPC .... *H01L 23/3128* (2013.01); *H01L 23/49822* (2013.01); *H01L 23/49838* (2013.01); *H01L 23/645* (2013.01); *H01L 24/16* (2013.01); *H01L 24/20* (2013.01); *H01L 25/0655* (2013.01); *H01L 23/564* (2013.01); *H01L 24/81* (2013.01); *H01L 2224/16237* (2013.01); *H01L 2224/2101* (2013.01); *H01L 2224/81801* (2013.01)

(58) Field of Classification Search
  USPC .................................................. 257/787, 758
  See application file for complete search history.

(56) References Cited

U.S. PATENT DOCUMENTS

| | | | | |
|---|---|---|---|---|
| 2003/0141105 | A1* | 7/2003 | Sugaya | H01L 21/56 257/E23.125 |
| 2007/0289127 | A1* | 12/2007 | Hurwitz | H01L 21/4857 257/E23.005 |
| 2011/0316147 | A1* | 12/2011 | Shih | H01L 23/147 257/737 |
| 2012/0228754 | A1* | 9/2012 | Liu | A61P 19/00 257/676 |
| 2019/0131270 | A1* | 5/2019 | Lee | H01L 24/19 |
| 2019/0198437 | A1* | 6/2019 | Kim | H01L 23/49811 |
| 2020/0098692 | A1* | 3/2020 | Liff | H01L 23/5386 |

FOREIGN PATENT DOCUMENTS

| | | |
|---|---|---|
| CN | 206312887 U | 7/2017 |
| CN | 108768335 A | 11/2018 |
| WO | 2018/063196 A1 | 4/2018 |

* cited by examiner

CHIP ENCAPSULATION STRUCTURE AND ENCAPSULATION METHOD

CROSS REFERENCE

This application is a Section 371 National Stage Application of International Application No. PCT/CN2019/088777, filed on May 28, 2019, entitled "CHIP ENCAPSULATION STRUCTURE AND ENCAPSULATION METHOD", which is incorporated herein by reference in their entirety.

TECHNICAL FIELD

The present disclosure relates to a field of semiconductor technology, and in particular to a chip encapsulation structure and an encapsulation method.

BACKGROUND

Filters in communications are mainly divided into surface acoustic wave (SAW) filters and bulk acoustic wave (BAW) filters. In the BAW filter and the SAW filter, it is needed to ensure that a functional area of a chip is not in contact with any impurity, that is, an upper surface of the filter needs to be encapsulated to form a cavity structure. In a conventional SAW filter, a metal bump is generally grown on a bare wafer, the bare wafer is face-down bonded on a ceramic substrate, and then a module is sealed using a metal cap, a top sealing or a coating process, so as to form a cavity structure. However, the ceramic substrate results in a high soldering cost, a large encapsulation size, and an unstability of device installation results in a difference in device performances. In addition, the SAW filter may face down to cover an upper surface of a printed circuit board (PCB) substrate, and the SAW filter may be electrically connected to the PCB substrate through a gold ball, then an epoxy resin packing film may cover top of the SAW filter and the PCB substrate, so as to form a cavity structure. However, as disclosed in U.S. Pat. No. 6,492,194B1 published on Dec. 10, 2012, the epoxy resin film may be thermally compressed into inside of the metal bump of the chip, a coverage area may affect an encapsulation size and an encapsulation strength, and may have extremely high requirements for a SAW thermal compression pressure. A wafer encapsulation of a BAW chip is generally implemented using a wafer-level packaging (WLP) solution. However, the WLP process is complicated and requires two wafers to be bonded, which is extremely expensive and involves through silicon via etching, Au—Au bonding and other complicated processes, which is prone to a chip failure due to process problems. Moreover, the WLP process may not be used to directly perform a multi-chip integrated encapsulation, as disclosed in U.S. Pat. No. 6,787,897B2 published on Sep. 7, 2004.

In order to meet increasingly complex system functions of products, encapsulation technology of multi-chip interconnection and integration is developing rapidly. A current mainstream solution is that a plurality of chips are horizontally distributed side by side and soldered to a substrate through a bump, a signal interconnection between the chips is achieved through an internal circuit of the substrate, the chip is protected by plastic encapsulation, and the module is soldered to the PCB as a whole, so as to achieve the interconnection and integration of the product. This method requires a multi-layer wiring transfer to achieve the interconnection between chips, and a large thickness of the metal layer and the dielectric layer of the substrate may result in a signal transmission delay, a large encapsulation thickness, a high encapsulation cost, and other problems, as disclosed in Chinese Patent No. 205264695U published on May 25, 2016.

SUMMARY

The present disclosure provides a chip encapsulation structure and a chip encapsulation method in order to solve at least the above-mentioned technical problems.

The present disclosure provides a chip encapsulation structure, including: a wafer provided with a groove; a first metal wire arranged on a side surface of the groove, two sides of a bottom surface of the groove and an upper surface of the wafer; a metal solder ball arranged on the first metal wire or on a metal pad of the chip, wherein the metal solder ball is configured to solder the metal pad of the chip to the first metal wire, so as to face-down bond the chip into the groove; a first plastic encapsulation film covering the upper surface of the wafer, an upper surface of the chip and an upper surface of the first metal wire, and entering a gap between a periphery of a functional area of the chip and the first metal wire, so as to form a closed cavity among the wafer, the groove and the chip; an inductive structure arranged on an upper surface of the first plastic encapsulation film and/or a lower surface of the wafer, and connected to the chip through the first metal wire; and a pad arranged on the inductive structure.

Optionally, the inductive structure includes one or more sets of a second plastic encapsulation film, a second metal wire and a third metal wire, the third metal wire is arranged on a first surface of the second plastic encapsulation film according to a preset shape, and the second metal wire passes through a hollow window of the second plastic encapsulation film, so as to sequentially connect the third metal wire in each set.

Optionally, the inductive structure is arranged on an upper surface of the first plastic encapsulation film, the first surface is an upper surface, and the second metal wire passes through a hollow window of the first plastic encapsulation film so as to connect the third metal wire in a first set to the first metal wire.

Optionally, a first metal wire lead wire passes through a hollow window of the wafer and is connected to the first metal wire, the inductive structure is arranged on the lower surface of the wafer and is located on a lower surface of the first metal wire lead wire, the first surface is a lower surface, and the second metal wire in a first set is connected to the first metal wire lead wire, so as to connect the third metal wire in the first set to the first metal wire.

Optionally, the chip corresponds to two inductive structures respectively arranged on the upper surface of the first plastic encapsulation film and a lower surface of the wafer; the first surface corresponding to the inductive structure arranged on the upper surface of the first plastic encapsulation film is an upper surface, and the second metal wire in a first set of the inductive structure arranged on the upper surface of the first encapsulation film passes through a hollow window of the first plastic encapsulation film, so as to connect the third metal wire in the first set to the first metal wire; the first surface corresponding to the inductive structure arranged on the lower surface of the wafer is a lower surface, a first metal wire lead wire passes through a hollow window of the wafer and is connected to the first metal wire, the inductive structure is located on a lower surface of the first metal wire lead wire, and the second metal wire in the first set of the inductive structure arranged on the lower surface of the wafer is connected to the first metal wire lead wire, so as to connect the third metal wire in the first set to the first metal wire.

Optionally, the first plastic encapsulation film on the upper surface of the first metal wire has a thickness of 20 µm to 50 µm.

The present disclosure further provides a chip encapsulation method, including: S1, preparing a groove in a wafer; S2, preparing a first metal wire on a side surface of the groove, two sides of a bottom surface of the groove and an upper surface of the wafer; S3, preparing a metal solder ball on the first metal wire or on a metal pad of the chip, wherein the metal pad of the chip is soldered to the first metal wire through the metal solder ball, so as to face-down bond the chip into the groove; S4, preparing a first plastic encapsulation film on the upper surface of the wafer, an upper surface of the chip and an upper surface of the first metal wire, wherein the first plastic encapsulation film enters a gap between a periphery of a functional area of the chip and the first metal wire, so as to form a closed cavity among the wafer, the groove and the chip; S5, preparing an inductive structure on an upper surface of the first plastic encapsulation film and/or a lower surface of the wafer, and connecting the inductive structure to the first metal wire; and S6, preparing a pad on the inductive structure.

Optionally, the inductive structure is arranged on the upper surface of the first plastic encapsulation film, and the step S5 includes: S51, preparing a second plastic encapsulation film on the upper surface of the first plastic encapsulation film; S52, windowing the second plastic encapsulation film; S53, windowing the first plastic encapsulation film so as to expose the first metal wire; S54, preparing a second metal wire in a windowed hollow window, and preparing a third metal wire on an upper surface of the second plastic encapsulation film according to a preset shape; and S55, performing step S51, step S52 and step S54 repeatedly for a preset number of times.

Optionally, the inductive structure is arranged on the lower surface of the wafer, and the step S5 includes: S51, windowing the lower surface of the wafer so as to expose the first metal wire, and preparing a first metal wire lead wire in a hollow window of the wafer; S52, preparing a second plastic encapsulation film on a lower surface of the first metal wire lead wire; S53, windowing the second plastic encapsulation film; S54, preparing a second metal wire in a hollow window of the second plastic encapsulation film, and preparing a third metal wire on a lower surface of the second plastic encapsulation film according to a preset shape; and S55, performing step S52, step S53 and step S54 repeatedly for a preset number of times.

Optionally, the chip corresponds to two inductive structures respectively arranged on the upper surface of the first plastic encapsulation film and the lower surface of the wafer, and the step S5 includes: S51, windowing the lower surface of the wafer so as to expose the first metal wire, and preparing a first metal wire lead wire in a hollow window of the wafer; S52, preparing a second plastic encapsulation film on the upper surface of the first plastic encapsulation film and a lower surface of the first metal wire lead wire, respectively; S53, windowing the second plastic encapsulation film; S54, windowing the first plastic encapsulation film; S55, preparing a second metal wire in an windowed hollow window, and respectively preparing a third metal wire on the second plastic encapsulation film on the upper surface and the second plastic encapsulation film on the lower surface according to a preset shape; and S56, performing step S52, step S53 and step S55 repeatedly for a preset number of times.

REFERENCE NUMERALS

Figure 1:
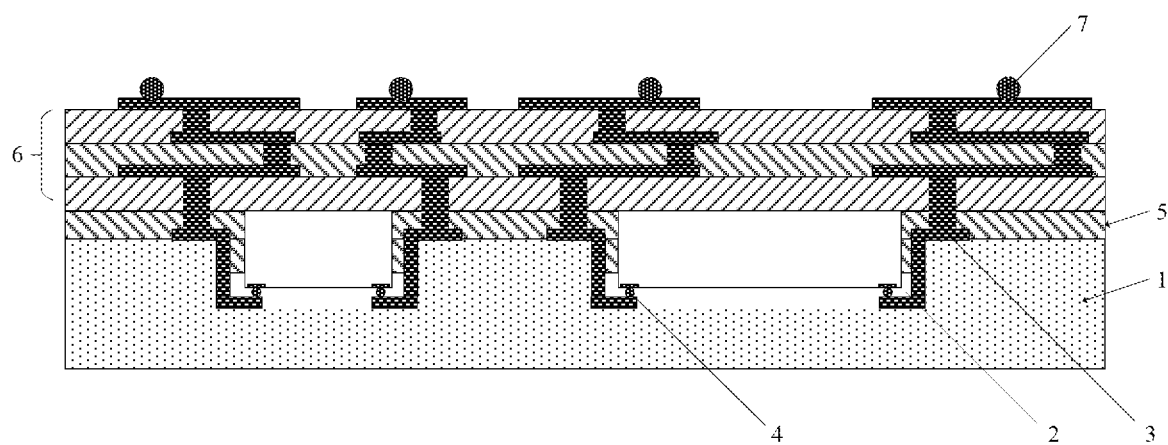
FIG. 1 schematically shows a schematic diagram of a chip encapsulation structure according to the embodiments of the present disclosure.

1—wafer
2—groove
3—first metal wire
3'—first metal wire lead wire
4—metal solder ball
5—first plastic encapsulation film
6—inductive structure
7—pad
8—second plastic encapsulation film
9'—hollow window
9—second metal wire
10—third metal wire
20—chip A groove
21—chip B groove
22—chip C groove
23—multi-chip groove unit
24—chip A
25—chip B
26—cavity

DETAILED DESCRIPTION OF EMBODIMENTS

In order to make objectives, technical solutions and advantages of the present disclosure more apparent, the present disclosure will be further described in detail below in connection with specific embodiments and with reference to the accompanying drawings.

A first embodiment of the present disclosure shows a chip encapsulation structure. The chip encapsulation structure will be described in detail with reference to FIG. 1, FIG. 3, FIG. 9 and FIG. 10.

The chip encapsulation structure includes a wafer 1, a groove 2, a first metal wire 3, a metal solder ball 4, a first plastic encapsulation film 5, an inductive structure 6 and a pad 7.

Figure 3:
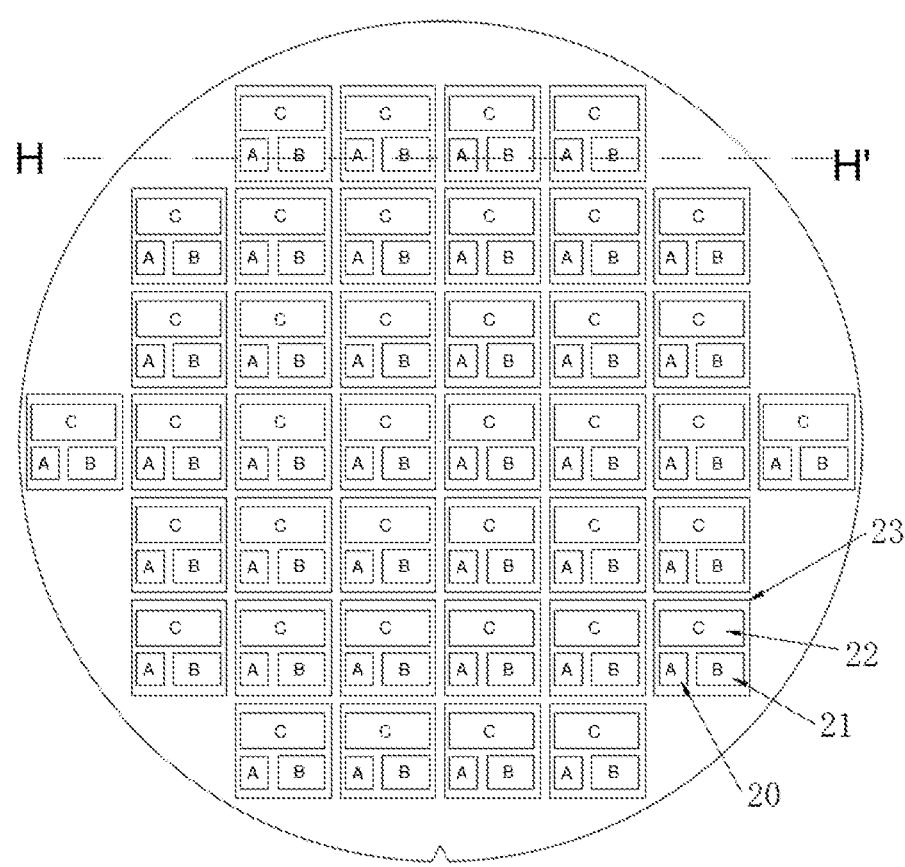
FIG. 3 schematically shows a schematic diagram of a distribution of groove units on a wafer according to the embodiments of the present disclosure.

A material of the wafer 1 is one of silicon, glass, sapphire, ceramic, or a mixed material mainly composed of silicon, glass, sapphire, and ceramic. The groove 2 is arranged in the wafer 1. Further, as shown in FIG. 3, a plurality of sets of multi-chip groove units 23 may be provided in the wafer 1, and each set of the multi-chip groove unit 23 may include a plurality of grooves for respectively integrally encapsulating different chips $A_1, A_2, \ldots A_n$. In this embodiment, each set of groove unit including a chip A groove 20, a chip B groove 21 and a chip C groove 22 is illustrated by way of example. It should be understood that the multi-chip groove unit 23 may further include chip grooves of other numbers and other sizes. The groove 2 has a depth not greater than a height of a corresponding chip.

The first metal wire 3 is arranged on a side surface of the groove 2, two sides of a bottom surface of the groove 2, and an upper surface of the wafer 1. The metal solder ball 4 is arranged on the first metal wire 3 or on a metal pad of the chip, specifically, on the first metal wire 3 on the two sides of the bottom surface of the groove 2 or on the metal pad of the chip. The metal solder ball 4 should be aligned with pins of metal silicon sheets (pad) of the chip, or the metal solder ball 4 should be aligned with the first metal wire 3 on the two sides of the bottom surface of the groove 2, so that the metal pad of the chip may be aligned and soldered to the first metal wire 3 on the two sides of the bottom surface of the groove 2 through the metal solder ball 4, so as to face-down bond the chip into the groove 2.

The first plastic encapsulation film 5 covers the upper surface of the wafer 1, an upper surface of the chip, and an upper surface of the first metal wire 3, and enters a gap between a periphery of a functional area of the chip and the first metal wire 3, so as to form a closed cavity among the wafer 1, the groove 2 and the chip. The first plastic encapsulation film 5 on the upper surface of the first metal wire 3 has a thickness of 20 μm to 50 μm, so as to prevent an exposure of the first metal wire 3.

The inductive structure 6 is arranged on the upper surface of the first plastic encapsulation film 5 and/or a lower surface of the wafer 1, and is connected to the chip through the first metal wire 3. The inductive structure 6 includes one or more sets of a second plastic encapsulation film 8, a second metal wire 9 and a third metal wire 10, and the third metal wire 10 in each set may have a different shape to achieve a corresponding filtering effect. The inductive structure 6 may exhibit three structures, as shown in FIG. 1, FIG. 9 and FIG. 10, respectively.

Referring to FIG. 1, the inductive structure 6 is arranged on the upper surface of the first plastic encapsulation film 5. Specifically, the second plastic encapsulation film 8 is provided with a hollow window passing therethrough, which may expose the third metal wire 10. The first plastic encapsulation film 5 is also provided with a hollow window passing therethrough, which may expose the first metal wire 3 on the upper surface of the wafer 1. The third metal wire 10 is arranged on an upper surface of the second plastic encapsulation film 8 according to a preset shape. The second metal wire 9 passes through the hollow window of the second plastic encapsulation film 8 so as to sequentially connect the third metal wire 10 in each set. The second metal wire 9 in a first set further passes through the hollow window of the first plastic encapsulation film 5, so as to connect the third metal wire 10 in the first set to the first metal wire 3, thereby connecting the inductive structure 6 to the chip.

Figure 9:
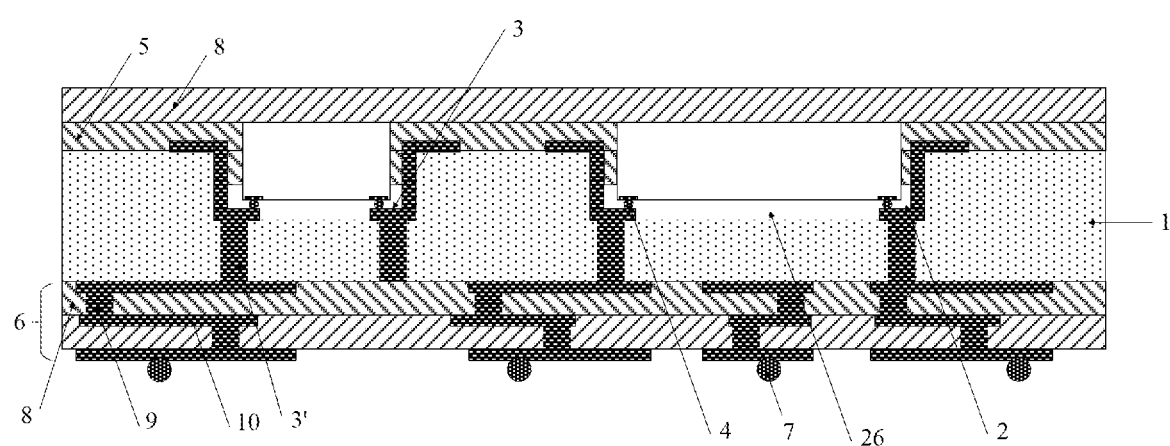
FIG. 9 is a schematic diagram of another chip encapsulation structure.

Referring to FIG. 9, the inductive structure 6 is arranged on a lower surface of the wafer 1. Specifically, the second plastic encapsulation film 8 is provided with a hollow window passing therethrough, which may expose the third metal wire 10. The wafer 1 is also provided with a hollow window passing therethrough, which may expose the first metal wire 3 on two sides of the bottom surface of the groove 2. The third metal wire 10 is arranged on a lower surface of the second plastic encapsulation film 8 according to a preset shape. The second metal wire 9 passes through the hollow window of the second plastic encapsulation film 8 so as to sequentially connect the third metal wire 10 in each set. Moreover, a first metal wire lead wire 3' is further provided to pass through the hollow window of the wafer 1. The second metal wire 9 in the first set is connected to the first metal wire lead wire 3', so as to connect the third metal wire 10 in the first set to the first metal wire 3 through the first metal wire lead wire 3' and the second metal wire 9, thereby connecting the inductive structure 6 to the chip. It may be understood that in this structure, the first metal wire 3 may not be provided on the upper surface of the wafer 1, that is, the first metal wire 3 is only provided on the two sides of the bottom surface of the groove 2.

Figure 10:
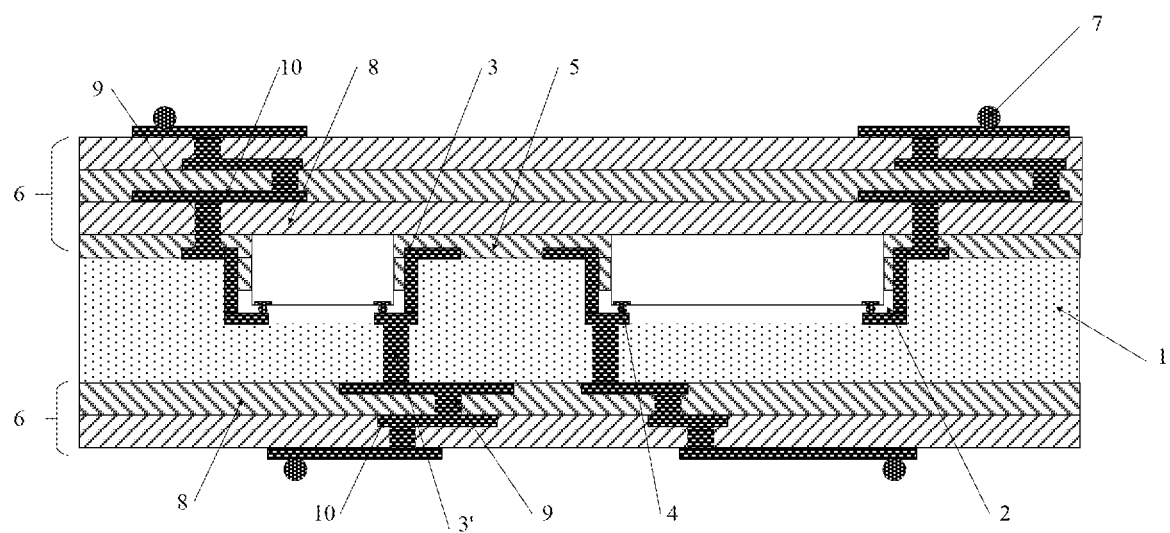
FIG. 10 is a schematic diagram of another chip encapsulation structure.

Referring to FIG. 10, in order to meet requirements for a more complex circuit connection, the inductive structure 6 may be provided on both the upper surface of the first plastic encapsulation film 5 and the lower surface of the wafer 1. Specifically, the first metal wire lead wire 3' is provided on the lower surface of the wafer 1, and the lower surface of the wafer 1 is provided with a hollow window passing therethrough, which may expose the first metal wire 3 on the two sides of the bottom surface of the groove 2. The second plastic encapsulation film 8 on the lower surface of the wafer 1 is provided with a hollow window passing therethrough, which may expose the third metal wire 10 on the lower surface of the wafer 1 and further expose the first metal wire lead wire 3' on the lower surface of the wafer 1. The second plastic encapsulation film 8 on the upper surface of the wafer 1 (specifically on the upper surface of the first plastic encapsulation film 5) is provided with a hollow window passing therethrough, and the first plastic encapsulation film 5 on the upper surface of the wafer 1 is also provided with a hollow window passing therethrough, which may expose the first metal wire 3 on the upper surface of the wafer 1. The third metal wire 10 in the inductive structure 6 arranged on the upper surface of the first plastic encapsulation film 5 is arranged on the upper surface of the second plastic encapsulation film 8 according to a preset shape, and the third metal wire 10 in the inductive structure 6 arranged on the lower surface of the wafer 1 is arranged on the lower surface of the second plastic encapsulation film 8 according to a preset shape. The second metal wire 9 passes through the hollow window of the second plastic encapsulation film 8 so as to sequentially connect the third metal wire 10 in each set. The second metal wire 9 in the first set in the two inductive structures 6 further passes through the hollow window of the first plastic encapsulation film 5 and the hollow window of the second plastic encapsulation film 8, so as to respectively connect the third metal wire 10 in the first set to the first metal wire 3 and the first metal wire lead wire 3', thereby connecting the two inductive structures 6 to the chip.

The pad 7 is arranged on the inductive structure 6, specifically on the third metal wire 10 in an outermost set in the inductive structure 6.

Figure 2:
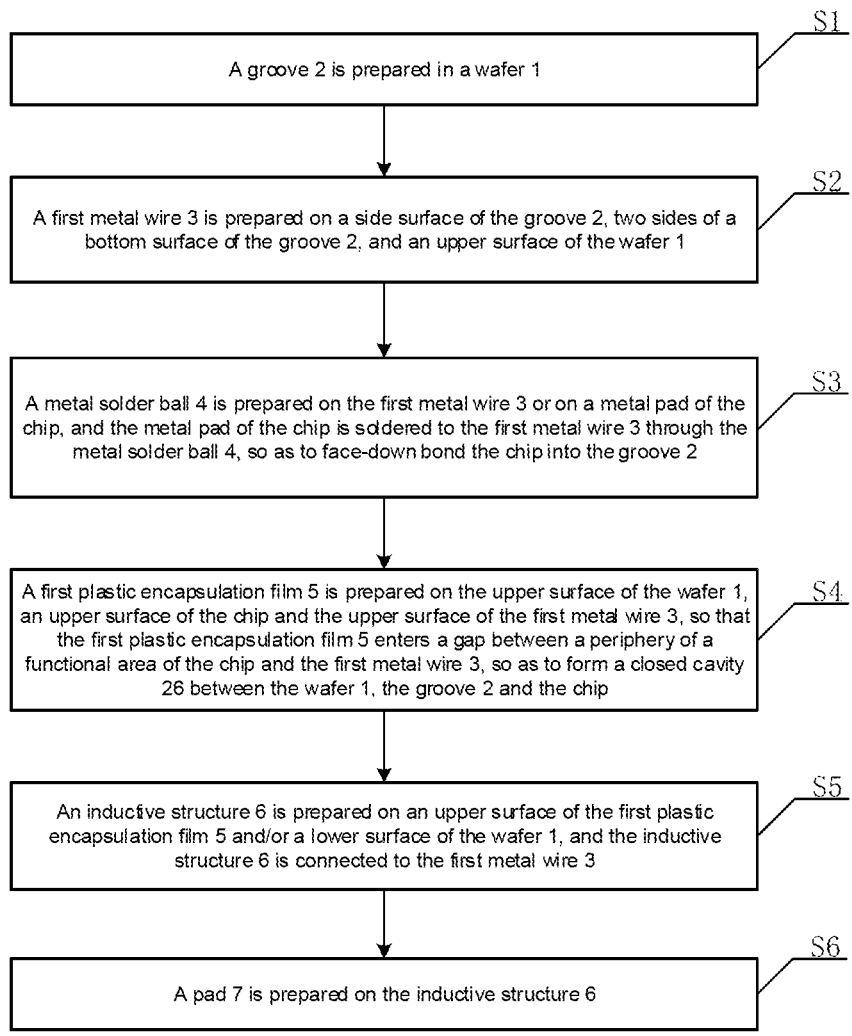
FIG. 2 schematically shows a flowchart of a chip encapsulation method according to the embodiments of the present disclosure.

As shown in FIG. 2, a second embodiment of the present disclosure shows a chip encapsulation method. The encapsulation will be described in detail with reference to FIG. 3 to FIG. 10, which mainly includes the following operations.

In S1, a groove 2 in prepared in a wafer 1.

A material of the wafer 1 is one of silicon, glass, sapphire, ceramic, or a mixed material mainly composed of silicon, glass, sapphire, and ceramic. In this embodiment, a glass wafer is used as a chip carrier and an encapsulation material, so that a material cost is greatly reduced compared with using a ceramic substrate, a plastic substrate, and a silicon Au—Au bonding wafer-level encapsulation structure.

The groove 2 is prepared in the wafer 1. Referring to FIG. 3, a plurality of groove units 23 may be provided in the wafer 1, and each set of groove unit 23 may include a plurality of grooves for respectively integrally encapsulating different chips $A_1, A_2, \ldots A_n$. In this embodiment, each set of groove unit including a chip A groove, a chip B groove and a chip C groove is illustrated by way of example. It should be understood that the groove unit 23 may further include chip grooves of other numbers and other sizes. The groove 2 has a depth not greater than a height of a corresponding chip.

Figure 4:
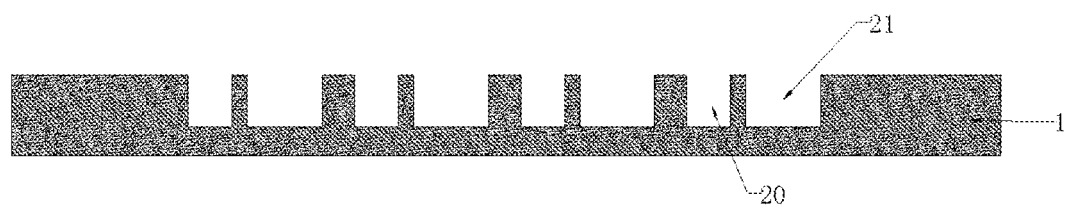
FIG. 4 schematically shows a schematic cross-sectional view of FIG. 3 taken along line H-H'.

In this embodiment, each set of groove unit including the chip A groove, the chip B groove and the chip C groove is illustrated by way of example, and a cross section taken along a H-H' direction in FIG. 3 is shown by way of example. A schematic diagram thereof is shown in FIG. 4, which includes a plurality of sets of groove units, and each set of groove unit includes two grooves, which are a chip A groove 20 and a chip B groove 21.

In step S2, a first metal wire 3 is prepared on a side surface of the groove 2, two sides of a bottom surface of the groove 2, and an upper surface of the wafer 1.

Figure 5:
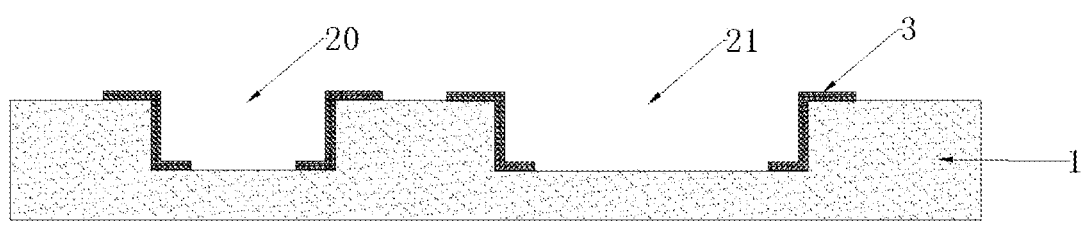
FIG. 5 is a schematic diagram of preparing a first metal wire 3 in step S2 of the chip encapsulation method.

Referring to FIG. 5, the first metal wire 3 is prepared by metal sputtering, photolithography, etching, or LIFF-OFF process.

In step S3, a metal solder ball 4 is prepared on the first metal wire 3 or on a metal pad of the chip, and the metal pad of the chip is soldered to the first metal wire 3 through the metal solder ball 4, so as to face-down bond the chip into the groove 2.

Figure 6:
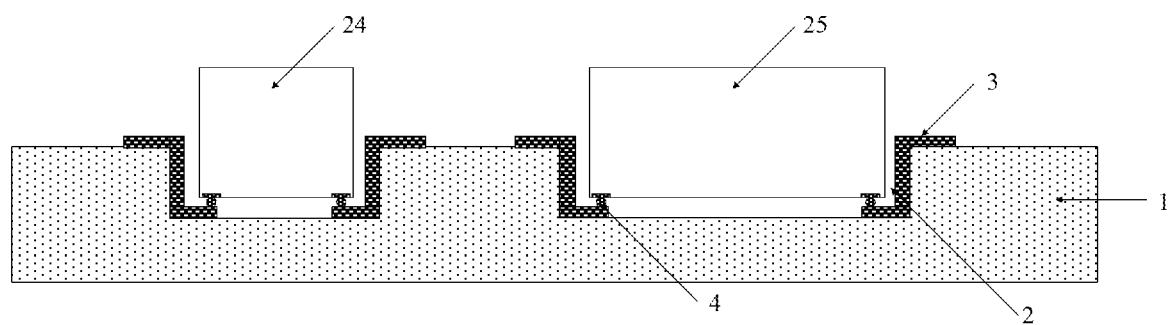
FIG. 6 is a schematic diagram of preparing a metal solder ball and flip chip in step S3 of the chip encapsulation method.

Referring to FIG. 6, the metal solder ball 4 is prepared on the first metal wire 3 on the two sides of the bottom surface of the groove 2. By using ultrasonic thermal compression bonding or thermal compression bonding, a chip A and a chip B are face-down bonded into the chip A groove 20 and the chip B groove 21, respectively, so that a metal pad of the chip A and a metal pad of the chip B are aligned and soldered to the metal solder ball 4 in the groove 2.

In addition, the metal solder ball 4 may be formed on the chip A and the chip B, and then the chip A and the chip B are soldered to the metal pad in the groove 2 through the metal solder ball 4.

It may be understood that all the chips $A_1, A_2, \ldots, A_n$ to be encapsulated may be face-down bonded into the groove 2 in accordance with the operation S3.

In S4, a first plastic encapsulation film 5 is prepared on the upper surface of the wafer 1, an upper surface of the chip and an upper surface of the first metal wire 3, so that the first plastic encapsulation film 5 enters a gap between a periphery of a functional area of the chip and the first metal wire 3, so as to form a closed cavity 26 between the wafer 1, the groove 2 and the chip.

Firstly, an encapsulation film (that is, the first plastic encapsulation film 5) is attached on the upper surface of the wafer 1, the upper surface of the chip, and the upper surface of the first metal wire 3 through thermal compression. The first plastic encapsulation film 5 may be a single-layer film or a multi-layer film. In this embodiment, a groove 2 suitable for various types of chips is pre-formed on the wafer 1, the face-down bonded chip is sealed by film coating, and a cavity structure of a functional area of the chip is formed at the same time. By controlling a depth and a width of the groove of the wafer 1 and controlling a precise alignment of face-down bonding, a relatively narrow gap may be reserved between the periphery of the chip and the groove 2. By controlling a film coating pressure and temperature in operation S4, a depth at which the plastic encapsulation film enters the gap may be controlled accurately, and it is possible to completely prevent the plastic encapsulation film from entering the functional area of the chip, so as to form a highly reliable cavity structure.

Figure 7A:
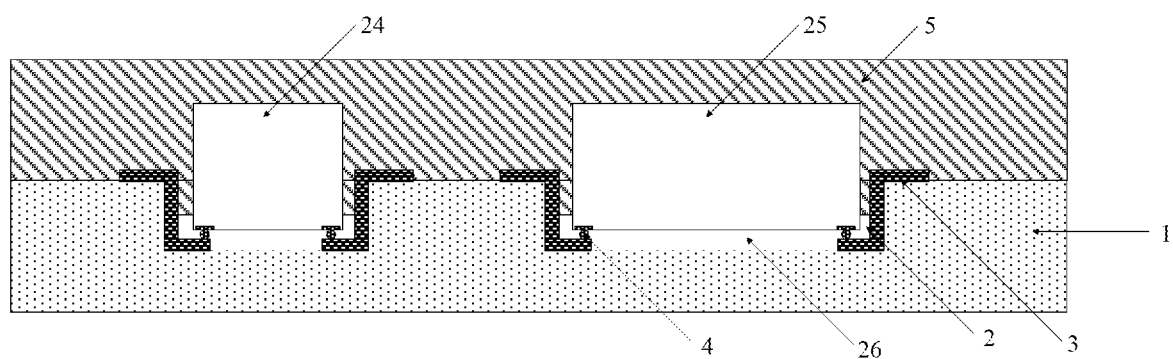
FIG. 7A and FIG. 7B are schematic diagrams of preparing a first plastic encapsulation film and thinning the first plastic encapsulation film in step S4 of the chip encapsulation method, respectively.

Secondly, a closed cavity structure between the surface of the groove 2 in the wafer 1 and the functional area of the chip is formed through high temperature curing, as shown in FIG. 7A. In operation S4, the high temperature curing is performed to cure the plastic encapsulation film, and the chip may be fixed in the encapsulation structure, so that the chip is not easily moved in the encapsulation structure, which may greatly increase a chip resistance to mechanical impact and an encapsulation air tightness, and may improve a reliability of the chip.

Figure 7B:
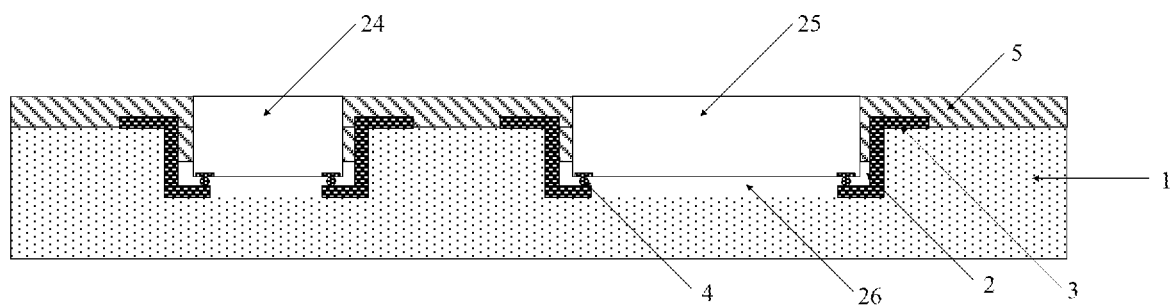

Then, a CMP thinning is performed on a plastic cover of the wafer 1 (that is, the first plastic encapsulation film 5), and a thinning thickness is controlled so that the thinning may stop above the first metal wire 3 on the upper surface of the wafer 1. Preferably, the first plastic encapsulation film 5 with a thickness of 20 μm to 50 μm is reserved on the first metal wire 3, as shown in FIG. 7B. After each chip is face-down bonded and encapsulated in the groove 2 of the wafer 1, the CMP thinning is performed on the plastic cover of the wafer 1, which may omit a thinning process of a main chip wafer during a manufacturing process and eliminate a risk of a sheet operation of the main chip wafer during the manufacturing process, so as to reduce a process difficulty. In addition, since the depth of the groove is limited, and the chip is embedded inside the groove when thinning, an ultra-thin encapsulation may be achieved.

In S5, an inductive structure 6 is prepared on an upper surface of the first plastic encapsulation film 5 and/or a lower surface of the wafer 1, and the inductive structure 6 is connected to the first metal wire 3.

The encapsulation method in this embodiment is directed to the three chip encapsulation structures shown in the first embodiment, therefore operation S5 may be divided into three cases.

(1) The inductive structure 6 is prepared on the upper surface of the first plastic encapsulation film 5. In this case, operation S5 includes the following sub-operations.

Figure 8A:
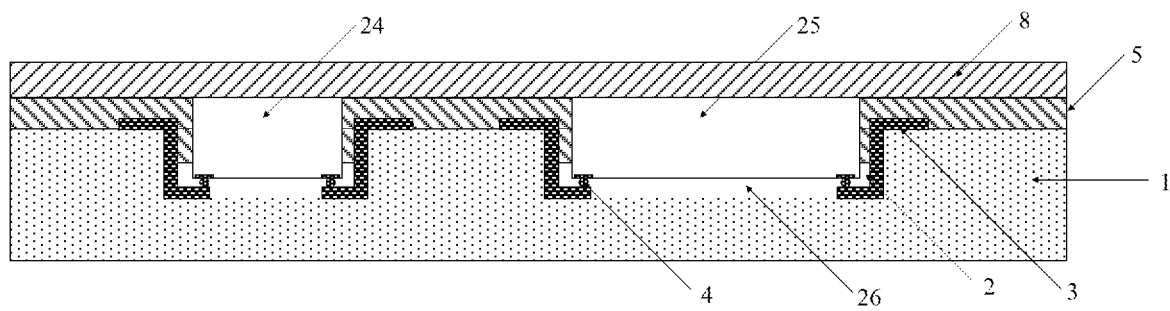
FIG. 8A, FIG. 8B, FIG. 8C and FIG. 8D are schematic diagrams of preparing an inductive structure and a pad in step S5 and step S6 of the chip encapsulation method.

In S51, as shown in FIG. 8A, the upper surface of the thinned first plastic encapsulation film 5 is covered with a second plastic encapsulation film 8, and a high temperature curing is performed.

In S52, the second plastic encapsulation film 8 is windowed by using a photolithographic etching process.

Figure 8B:
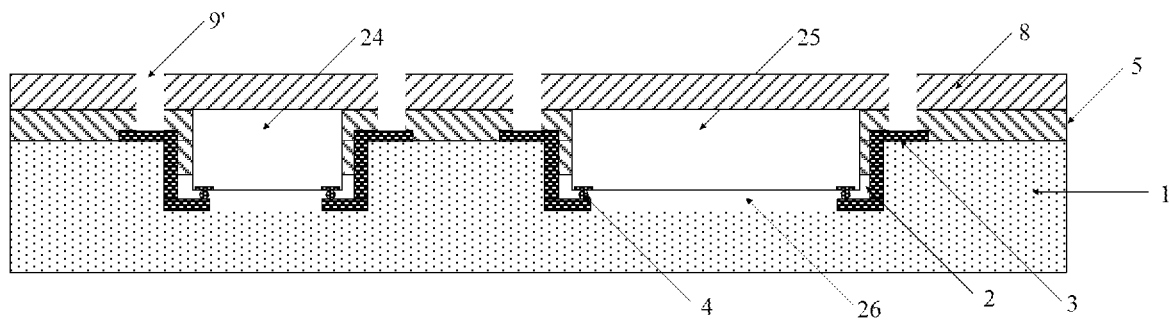

In S53, as shown in FIG. 8B the first plastic encapsulation film 5 is windowed by using a photolithographic etching process, so as to expose the first metal wire 3 on the upper surface of the wafer 1.

Figure 8C:
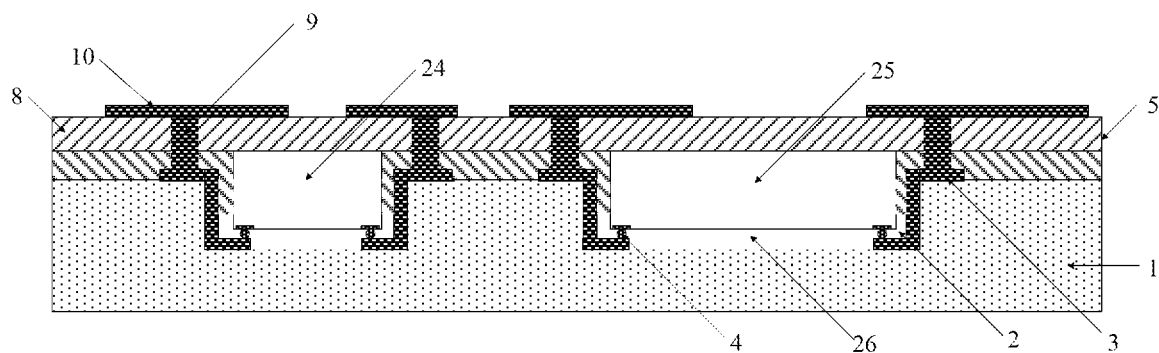

In S54, as shown in FIG. 8C, a metal layer (that is, a second metal wire 9) is formed in an windowed hollow window 9' by using a metal sputtering, electroplating or evaporation process, so as to lead out a metal wire under the window; after that, a metal rewiring is performed on an upper surface of the second plastic encapsulation film 8 by using a photolithographic etching process or a LIFT-OFF process, so as to prepare a third metal wire 10 on the upper surface of the second plastic encapsulation film 8 according to a preset shape.

Figure 8D:
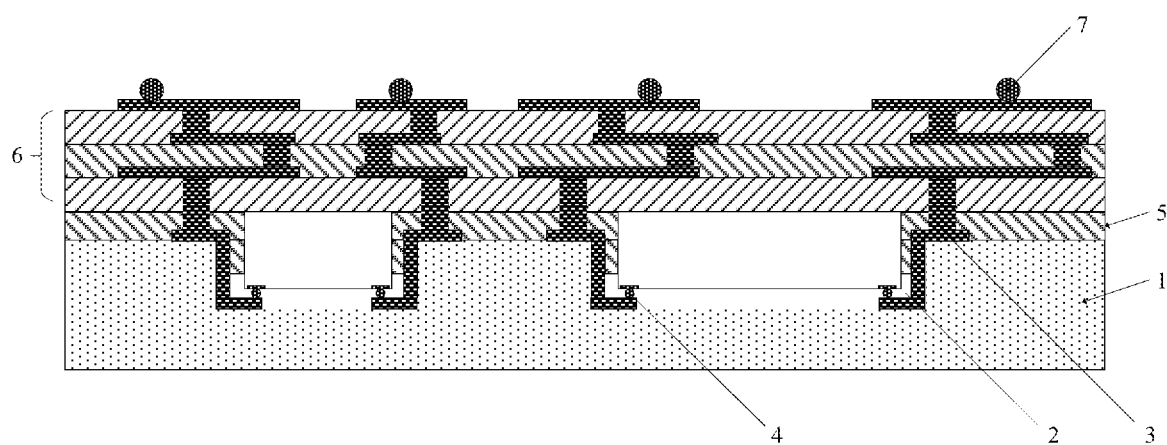

In S55, as shown in FIG. 8D, operations S51, S52 and S54 are repeatedly performed for a preset number of times, so as to form a multi-layer metal wiring used for manufacturing an inductive structure required for a filter circuit. In addition, in this operation, the covering the second plastic encapsulation film 8 in operation S51 may also be replaced with depositing a dielectric layer.

(2) The inductive structure 6 is prepared on the lower surface of the wafer 1, the formed chip encapsulation structure is shown in FIG. 9. In this case, operation S5 may include the following sub-operations.

In S51, the lower surface of the wafer 1 is windowed so as to expose the first metal wire 3, and a first metal wire lead wire 3' is prepared in the hollow window of the wafer 1.

In S52, the upper surface and the lower surface of the wafer 1 are covered with a second plastic encapsulation film 8, and a high temperature curing is performed.

In S53, the second plastic encapsulation film 8 on the lower surface of the wafer 1 is windowed by using a photolithographic etching process, and the first metal wire lead wire 3' on the lower surface of the wafer 1 is exposed.

In S54, a metal layer (that is, the second metal wire 9) is formed in an windowed hollow window by using a metal sputtering, electroplating or evaporation process, so as to lead out the metal wire above the window; after that, a metal rewiring is performed on a lower surface of the second plastic encapsulation film 8 by using a photolithographic etching process or a LIFT-OFF process, so as to prepare a third metal wire 10 on the lower surface of the second plastic encapsulation film 8 according to a preset shape.

In S55, operations S52, S53 and S54 are repeatedly performed for a preset number of times, so as to form a multi-layer metal wiring used for manufacturing an inductive structure required for a filter circuit. In addition, in this operation, the covering the second plastic encapsulation film 8 in operation S51 may also be replaced with depositing a dielectric layer.

(3) The inductive structure 6 is respectively prepared on the upper surface of the first plastic encapsulation film 5 and the lower surface of the wafer 1, and the formed chip encapsulation structure is shown in FIG. 10. In this case, operation S5 may include the following sub-operations.

In S51, the lower surface of the wafer 1 is windowed so as to expose the first metal wire 3, and the first metal wire lead wire 3' is prepared in the hollow window of the wafer 1.

In S52, the upper surface of the thinned first plastic encapsulation film 5 and a lower surface of the first metal wire lead wire 3' of the wafer 1 are respectively covered with a second plastic encapsulation film 8, and a high temperature curing is performed.

In S53, the second plastic encapsulation film 8 on the upper surface and the second plastic encapsulation film 8 on the lower surface are respectively windowed by using a photolithographic etching process, at this time, the first metal wire lead wire 3' on the lower surface of the wafer 1 is already exposed.

In S54, the first plastic encapsulation film 5 on the upper surface is windowed by using a photolithographic etching process, so as to expose the first metal wire 3 on the upper surface of the wafer 1.

In S55, a metal layer (that is, the second metal wire 9) is formed in the windowed hollow window by using a metal sputtering, electroplating or evaporation process, so as to respectively lead out the metal wire above the window and the metal wire below the window; then, a metal rewiring is performed on the upper surface of the second plastic encapsulation film 8 located above the first plastic encapsulation film 5 and on the lower surface of the second plastic encapsulation film 8 located below the first metal wire lead wire 3' under the wafer 1 by using a photolithographic etching process or a LIFT-OFF process, so as to prepare the third metal wire 10 on the upper surface of the second plastic encapsulation film 8 located on the wafer 1 and on the lower surface of the second plastic encapsulation film 8 located below the first metal wire lead wire 3' under the wafer 1 according to a preset shape.

In S56, operations S52, S53 and S55 are repeatedly performed for a preset number of times, so as to form a multi-layer metal wiring used for manufacturing an inductive structure required for a filter circuit. In addition, in this operation, the covering the second plastic encapsulation film 8 in operation S51 may also be replaced with depositing the dielectric layer.

In operation S5, the metal rewiring is performed on the surface of the encapsulated wafer, which may achieve an integration of a inductive circuit, so that an expensive and complicated substrate manufacturing process may be omitted. In this embodiment, a multi-chip groove is prepared, and after a multi-chip encapsulation, the metal rewiring is performed on the surface of the wafer, which may meet integrated encapsulation requirements of different types of chips, and may greatly reduce an encapsulation area through reasonable planning, so that an extremely small and ultra-thin encapsulation may be achieved.

In addition, a multi-layer metal wiring is performed after the integrated encapsulation of the various chips, which may achieve a comprehensive impedance matching requirement of various radio frequency chips, achieve a modular and integrated manufacturing of a radio frequency front-end chip, and reduce a debugging work of users.

It should be further noted that the second plastic encapsulation film 8 in this embodiment may be replaced with an epoxy resin black adhesive or a glass film.

In S6, a pad 7 is prepared on the inductive structure 6.

A metal bump or the pad 7 is prepared on an outermost layer of metal wiring, and a multi-chip module on the wafer 1 is diced, tested, and encapsulated.

The chip encapsulation structure and the chip encapsulation method provided in the present disclosure are described in detail, which are mainly suitable for a multi-chip fan-out system-level encapsulation to form a cavity encapsulation structure with a reliable performance, particularly suitable for encapsulating a Micro-Electro-Mechanical System (MEMS) device such as an acoustic wave filter, a microphone, and so on, in which a cavity structure needs to be formed on the surface. The chip encapsulation structure and the chip encapsulation method of the present disclosure may further achieve a multi-chip rewiring, and may achieve a multi-chip system integrated inductive wiring function. In addition, a multi-chip thinning function may be achieved after dicing and face-down bonding, which may avoid a process abnormality caused by a chip sheet processing risk, and finally achieve the ultra-thin encapsulation.

The chip encapsulation structure and the chip encapsulation method provided by the present disclosure have at least the following beneficial effects.

(1) By sealing the face-down bonded chip using film coating and performing a high temperature curing, it is possible to prevent the plastic encapsulation film from entering the functional area of the chip, so that a highly reliable cavity structure may be formed. Furthermore, the chip may be fixed using the groove structure, so that a chip resistance to mechanical impact and an encapsulation air tightness may be improved.

(2) By performing the CMP thinning on the coated wafer, a sheet operation risk of the main chip wafer during the manufacturing process may be eliminated, and a process difficulty may be reduced.

(3) By performing a metal rewiring on the surface of the encapsulated wafer, an inductive circuit integration may be achieved, and costs may be reduced. Furthermore, through the multi-layer metal wiring, a comprehensive impedance matching requirement of various radio frequency chips may be achieved, and an integrated manufacturing may be achieved.

The above-described specific embodiments have described in detail the objectives, the technical solutions and the advantages of the present disclosure. It should be understood that the above are only specific embodiments of the present disclosure, and are not intended to limit the present disclosure. Any modifications, equivalent substitutions, improvements, etc., made within the spirit and scope of the present disclosure shall be contained within the scope of the present disclosure.

What is claimed is:

1. A chip encapsulation structure, comprising:
   a wafer provided with a groove;
   a first metal wire arranged on a side surface of the groove, two sides of a bottom surface of the groove and an upper surface of the wafer;
   a metal solder ball arranged on the first metal wire or on a metal pad of the chip, wherein the metal solder ball is configured to solder the metal pad of the chip to the first metal wire, so as to face-down bond the chip into the groove;
   a first plastic encapsulation film covering the upper surface of the wafer, an upper surface of the chip and an upper surface of the first metal wire, and entering a gap between a periphery of a functional area of the chip and the first metal wire, so as to form a closed cavity among the wafer, the groove and the chip;
   an inductive structure arranged on an upper surface of the first plastic encapsulation film and/or a lower surface of the wafer, and connected to the chip through the first metal wire; and
   a pad arranged on the inductive structure.

2. The chip encapsulation structure of claim 1, wherein the inductive structure comprises one or more sets of a second plastic encapsulation film, a second metal wire and a third metal wire, the third metal wire is arranged on a first surface of the second plastic encapsulation film according to a preset shape, and the second metal wire passes through a hollow window of the second plastic encapsulation film, so as to sequentially connect the third metal wire in each set.

3. The chip encapsulation structure of claim 2, wherein the inductive structure is arranged on an upper surface of the first plastic encapsulation film, the first surface is an upper surface, and the second metal wire passes through a hollow window of the first plastic encapsulation film so as to connect the third metal wire in a first set to the first metal wire.

4. The chip encapsulation structure of claim 2, wherein a first metal wire lead wire passes through a hollow window of the wafer and is connected to the first metal wire, the inductive structure is arranged on the lower surface of the wafer and is located on a lower surface of the first metal wire lead wire, the first surface is a lower surface, and the second metal wire in a first set is connected to the first metal wire lead wire, so as to connect the third metal wire in the first set to the first metal wire.

5. The chip encapsulation structure of claim 2, wherein the chip corresponds to two inductive structures respectively arranged on the upper surface of the first plastic encapsulation film and a lower surface of the wafer;
   the first surface corresponding to the inductive structure arranged on the upper surface of the first plastic encapsulation film is an upper surface, and the second metal wire in a first set of the inductive structure arranged on the upper surface of the first encapsulation film passes through a hollow window of the first plastic encapsulation film, so as to connect the third metal wire in the first set to the first metal wire;
   the first surface corresponding to the inductive structure arranged on the lower surface of the wafer is a lower surface, a first metal wire lead wire passes through a hollow window of the wafer and is connected to the first metal wire, the inductive structure is located on a lower surface of the first metal wire lead wire, and the second metal wire in the first set of the inductive structure arranged on the lower surface of the wafer is connected to the first metal wire lead wire, so as to connect the third metal wire in the first set to the first metal wire.

6. The chip encapsulation structure of claim 1, wherein the first plastic encapsulation film on the upper surface of the first metal wire has a thickness of 20 μm to 50 μm.

7. A chip encapsulation method, comprising steps:
   S1, preparing a groove in a wafer;
   S2, preparing a first metal wire on a side surface of the groove, two sides of a bottom surface of the groove and an upper surface of the wafer;
   S3, preparing a metal solder ball on the first metal wire or on a metal pad of the chip, wherein the metal pad of the chip is soldered to the first metal wire through the metal solder ball, so as to face-down bond the chip into the groove;
   S4, preparing a first plastic encapsulation film on the upper surface of the wafer, an upper surface of the chip and an upper surface of the first metal wire, wherein the first plastic encapsulation film enters a gap between a periphery of a functional area of the chip and the first metal wire, so as to form a closed cavity among the wafer, the groove and the chip;
   S5, preparing an inductive structure on an upper surface of the first plastic encapsulation film and/or a lower surface of the wafer, and connecting the inductive structure to the first metal wire; and
   S6, preparing a pad on the inductive structure.

8. The chip encapsulation method of claim 7, wherein the inductive structure is arranged on the upper surface of the first plastic encapsulation film, and the step S5 comprises:
   S51, preparing a second plastic encapsulation film on the upper surface of the first plastic encapsulation film;
   S52, windowing the second plastic encapsulation film;
   S53, windowing the first plastic encapsulation film so as to expose the first metal wire;
   S54, preparing a second metal wire in a windowed hollow window, and preparing a third metal wire on an upper surface of the second plastic encapsulation film according to a preset shape; and S55, performing step S51, step S52 and step S54 repeatedly for a preset number of times.

9. The chip encapsulation method of claim 7, wherein the inductive structure is arranged on the lower surface of the wafer, and the step S5 comprises:
    S51, windowing the lower surface of the wafer so as to expose the first metal wire, and preparing a first metal wire lead wire in a hollow window of the wafer;
    S52, preparing a second plastic encapsulation film on a lower surface of the first metal wire lead wire;
    S53, windowing the second plastic encapsulation film;
    S54, preparing a second metal wire in a hollow window of the second plastic encapsulation film, and preparing a third metal wire on a lower surface of the second plastic encapsulation film according to a preset shape; and
    S55, performing step S52, step S53 and step S54 repeatedly for a preset number of times.

10. The chip encapsulation method of claim 7, wherein the chip calculation corresponds to two inductive structures respectively arranged on the upper surface of the first plastic encapsulation film and the lower surface of the wafer, and the step S5 comprises:
    S51, windowing the lower surface of the wafer so as to expose the first metal wire, and preparing a first metal wire lead wire in a hollow window of the wafer;
    S52, preparing a second plastic encapsulation film on the upper surface of the first plastic encapsulation film and a lower surface of the first metal wire lead wire, respectively;
    S53, windowing the second plastic encapsulation film;
    S54, windowing the first plastic encapsulation film;
    S55, preparing a second metal wire in a hollow window, and respectively preparing a third metal wire on the second plastic encapsulation film on the upper surface and the second plastic encapsulation film on the lower surface according to a preset shape; and
    S56, performing step S52, step S53 and step S55 repeatedly for a preset number of times.

* * * * *